(12) United States Patent
Dhuler et al.

(10) Patent No.: US 6,386,507 B2
(45) Date of Patent: May 14, 2002

(54) MICROELECTROMECHANICAL VALVES INCLUDING SINGLE CRYSTALLINE MATERIAL COMPONENTS

(75) Inventors: Vijayakumar R. Dhuler, Raleigh; Mark David Walters, Durham, both of NC (US)

(73) Assignee: JDS Uniphase Corporation, Research Triangle Park, NC (US)

( * ) Notice: Subject to any disclaimer, the term of this patent is extended or adjusted under 35 U.S.C. 154(b) by 0 days.

(21) Appl. No.: 09/802,260

(22) Filed: Mar. 8, 2001

Related U.S. Application Data

(62) Division of application No. 09/388,321, filed on Sep. 1, 1999.

(51) Int. Cl.$^7$ .......................... F16K 31/00; H02N 10/00
(52) U.S. Cl. .......................................... 251/11; 310/307
(58) Field of Search .............................. 251/11, 129.02, 251/129.01, 129.03; 310/307

(56) References Cited

U.S. PATENT DOCUMENTS

| | | | |
|---|---|---|---|
| 1,258,368 A | 3/1918 | Smith | |
| 1,658,669 A | 2/1928 | Cohn et al. | |

(List continued on next page.)

FOREIGN PATENT DOCUMENTS

| | | |
|---|---|---|
| DE | 38 09 597 | 10/1989 |
| EP | 0 469 749 | 2/1992 |
| EP | 0 478 956 | 4/1992 |
| EP | 0 665 590 | 8/1995 |
| FR | 764821 | 5/1934 |
| GB | 792145 | 3/1958 |

OTHER PUBLICATIONS

Klaassen E H et al: "Silicon Fusion Bonding and Deep Reactive Ion Etching: A New Technology For Microstructures" *Sensors And Actuators A*, vol. 52, No. 1/03, Mar. 1996, pp. 132–139.

Phipps, Thesis: Design And Development of Microswitches For Micro–Electro–Mechanical Relay Matrices, Air Force Inst. of Tech., Wright–Patterson AFB, OH School of Engineering, 1995.

Yamagata, et al., A Micro Mobile Mechanism Using Thermal Expansion And Its Theoretical Analysis—Comparison With Impact Drive Mechanism Using Piezoelectric Elements, *Proceedings of the IEEE Micro Electro Mechanical Systems*, 1994, pp 142–147.

(List continued on next page.)

*Primary Examiner*—Philippe Derakshani
*Assistant Examiner*—D. Austin Bonderer
(74) *Attorney, Agent, or Firm*—Myers Bigel Sibley & Sajovec

(57) ABSTRACT

A microelectromechanical (MEMS) device is provided that includes a microelectronic substrate and a thermally actuated microactuator and associated components disposed on the substrate and formed as a unitary structure from a single crystalline material, wherein the associated components are actuated by the microactuator upon thermal actuation thereof. For example, the MEMS device may be a valve. As such, the valve may include at least one valve plate that is controllably brought into engagement with at least one valve opening in the microelectronic substrate by selective actuation of the microactuator. While the MEMS device can include various microactuators, the microactuator advantageously includes a pair of spaced apart supports disposed on the substrate and at least one arched beam extending therebetween. By heating the at least one arched beam of the microactuator, the arched beams will further arch such that the microactuator moves between a closed position in which the valve plate sealingly engages the valve opening and an open position in which the valve plate is at least partly disengaged from and does not seal the valve opening.

15 Claims, 9 Drawing Sheets

U.S. PATENT DOCUMENTS

| | | | |
|---|---|---|---|
| 3,213,318 A | | 10/1965 | Glenn |
| 3,609,593 A | | 9/1971 | Bell et al. |
| 4,806,815 A | | 2/1989 | Honna |
| 5,179,499 A | * | 1/1993 | MacDonald et al. ........ 361/313 |
| 5,184,269 A | * | 2/1993 | Shimada et al. .............. 361/24 |
| 5,216,273 A | | 6/1993 | Doering et al. |
| 5,261,747 A | | 11/1993 | Deacutis et al. |
| 5,309,056 A | | 5/1994 | Culp |
| 5,355,712 A | | 10/1994 | Peterson et al. |
| 5,367,584 A | | 11/1994 | Ghezzo et al. |
| 5,441,343 A | | 8/1995 | Pylkki et al. |
| 5,467,068 A | | 11/1995 | Field et al. |
| 5,475,318 A | | 12/1995 | Marcus et al. |
| 5,483,799 A | | 1/1996 | Dalto |
| 5,536,988 A | | 7/1996 | Zhang et al. |
| 5,558,304 A | | 9/1996 | Adams |
| 5,600,174 A | | 2/1997 | Reay et al. |
| 5,602,955 A | | 2/1997 | Haake |
| 5,606,635 A | | 2/1997 | Haake |
| 5,629,665 A | | 5/1997 | Kaufmann et al. |
| 5,644,177 A | | 7/1997 | Guckel et al. |
| 5,659,285 A | | 8/1997 | Takeda |
| 5,722,989 A | | 3/1998 | Fitch et al. |
| 5,796,152 A | | 8/1998 | Carr et al. |
| 5,813,441 A | | 9/1998 | Dewispelaere |
| 5,862,003 A | | 1/1999 | Saif et al. |
| 5,867,302 A | | 2/1999 | Fleming |
| 5,870,518 A | * | 2/1999 | Haake et al. ................. 385/90 |
| 5,881,198 A | | 3/1999 | Haake |
| 5,909,078 A | * | 6/1999 | Wood et al. ................. 310/307 |
| 5,954,079 A | * | 9/1999 | Barth et al. ................... 137/13 |
| 5,994,816 A | * | 11/1999 | Dhuler et al. ............... 310/307 |
| 6,023,121 A | * | 2/2000 | Dhuler et al. ............... 310/307 |
| 6,114,794 A | * | 9/2000 | Dhuler et al. ............... 310/307 |
| 6,236,139 B1 | * | 5/2001 | Hill et al. .................... 310/307 |
| 6,275,320 B1 | * | 8/2001 | Dhuler et al. ............... 359/267 |

OTHER PUBLICATIONS

Oh, et al., Thin Film Heater On A Thermally Isolated Microstructure, *Smart Materials Fabrication and Materials for Micro–Electro–Mechanical Systems*, 1992, pp. 277–282.

Safranek, The Properties Of Electrodeposited Metals & Alloys, *Amer, Electroplaters & Surface Finishers Society*, 1986, pp. 295–315.

Klassen, et al. Silicon Fusion Bonding And Deep Reactive Ion Etching; A New Technology for Microstructures, *Transducers '95–Eurosensors IX*, The 8$^{th}$ International Conference On Solid State Sensors And Actuators, and Eurosensors IX, Stockholm, Sweden, Jun. 25–29, 1995, pp. 556–559.

Noworolski, et al., Fabrication Of SOI Wafers With Buried Cavities Using Silicon Fusion Bonding And Electromechanical Etchback, *Transducers '95–Eurosensors IX*, The 8$^{th}$ International Conference On Solid State Sensors And Actuators, and Eurosensors IX, Stockholm, Sweden, Jun. 25–29, 1995, pp. 71–74.

Single Crystal Silicon Actuators And Sensors Based On Silicon Fusion Bonding Technology, *Semiannual Progress Report 1, Advanced Research Projects Agency, Lucas NovaSensor*, Contact No. DAAL 01–94–C–3411, Apr. –Jul. 1994.

Single Crystal Silicon Actuators And Sensors Based On Silicon Fusion Bonding Technology, *Semiannual Progress Report 2, Advanced Research Projects Agency, Lucas NovaSensor*, Contract No. DAAL 01–94–C–3411, Jul 1994–Jan. 1995.

Single Crystal Silicon Actuators And Sensors Based On Silicon Fusion Bonding Technology, *Semiannual Progress Report, Advanced Research Projects Agency, Lucas NovaSensor*, Contract No. DAAL 01–94–C–3411, Jan.–Jul. 1995.

Single Crystal Silicon Actuators and Sensors Based On Silicon Fusion Bonding Technology, *Semiannual Progress Report, Advanced Research Projects Agency, Lucas NovaSensor*, Contract No. DAAL 01–94–C–3411, Jan.–Aug. 1996.

J.W. Judy et al., Surface Micromachined Linear Thermal Microactuator, *International Electron Devices Meeting 1990. Technical Digest CAT. No. 90CH2865–4*, Dec. 1990, New York, New York, pp. 629–632.

Fedder et al., Multimode Digital Control of a Suspended Polysilicon Microstructure, *Journal of Microelectromechanical Systems*, Dec. 1986, vol. 5, No. 4, pp. 283–297.

Comtois et al., Applications for Surface–Micromachined Polysilicon Thermal Actuators and Arrays, *Sensors and Actuators*, Jan. 1997, vol. 58, No. 1, pp. 19–25.

Lin et al., Vertically Driven Microactuators by Electrothermal Buckling Effects, *Sensors and Actuators*, Nov. 1998, vol. 17, No. 1–2, pp. 35–39.

* cited by examiner

MICROELECTROMECHANICAL VALVES INCLUDING SINGLE CRYSTALLINE MATERIAL COMPONENTS

CLAIM FOR PRIORITY AND CROSS-REFERENCE TO OTHER APPLICATION

This application is a divisional of parent application Ser. No. 09/388,321 filed Sep. 1, 1999, the disclosure of which is hereby incorporated herein by reference.

FIELD OF THE INVENTION

The present invention relates to microelectromechanical devices and associated fabrication methods and, more particularly, to microelectromechanical valves having single crystalline components and an associated fabrication method.

BACKGROUND OF THE INVENTION

Microelectromechanical structures (MEMS) and other microengineered devices are presently being developed for a wide variety of applications in view of the size, cost and reliability advantages provided by these devices. Many different varieties of MEMS devices have been created, including microgears, micromotors, and other micromachined devices that are capable of motion or applying force. These MEMS devices can be employed in a variety of applications including hydraulic applications in which MEMS pumps or valves are utilized, optical applications which include MEMS light valves and shutters, and electrical applications which include MEMS relays.

MEMS devices have relied upon various techniques to provide the force necessary to cause the desired motion within these microstructures. For example, controlled thermal expansion of an actuator or other MEMS component has been used to actuate MEMS devices. See, for example, U.S. Pat. No. 5,909,078 and U.S. patent application Ser. Nos. 08/936,598 and 08/965,277, all assigned to MCNC, also the assignee of the present invention, which describe MEMS devices having thermally actuated microactuators, the contents of which are incorporated herein by reference.

An example of a thermally actuated microactuator for a MEMS device comprises one or more arched beams extending between a pair of spaced apart supports. Thermal actuation of the microactuator causes further arching of the arched beams which results in useable mechanical force and displacement. The arched beams are generally formed from nickel using a high aspect ratio lithography technique which produces arched beams with aspect ratios up to 5:1. Although formed with high aspect ratio lithography, the actual nickel arched beams have rather modest aspect ratios and may therefore have less out-of-plane stiffness and be less robust than desired in some instances. Further, the lithography technique used to form nickel arched beams may result in the arched beams being spaced fairly far apart, thereby increasing the power required to heat the arched beams by limiting the amount that adjacent arched beams heat one another. In addition, the resulting microactuator may have a larger footprint than desired as a result of the spacing of the arched beams. Thus, there exists a need for arched beams having higher aspect ratios in order to increase the out-of-plane stiffness and the robustness of microactuators for MEMS devices. In addition, there is a desire for microactuators having more closely spaced arched beams to enable more efficient heating and a reduced size.

Nickel microactuators are typically heated indirectly, such as via a polysilicon heater disposed adjacent and underneath the actuator, since direct heating of the nickel structure (such as by passing a current therethrough) is inefficient due to the low resistivity of nickel. However, indirect heating of the microactuator of a MEMS device results in inefficiencies since not all heat is transferred to the microactuator due to the necessary spacing between the microactuator and the heater which causes some of the heat generated by the heater to be lost to the surroundings.

Nickel does have a relatively large coefficient of thermal expansion that facilitates expansion of the arched beams. However, significant energy must still be supplied to generate the heat necessary to cause the desired arching of the nickel arched beams due to the density thereof. As such, although MEMS devices having microactuators with nickel arched beams provide a significant advance over prior actuation techniques, it would still be desirable to develop MEMS devices having microactuators that could be thermally actuated in a more efficient manner in order to limit the requisite input power requirements.

Thermally actuated MEMS valve structures having nickel arched beam actuators typically also have valve plates comprised of nickel. Since the limited aspect ratios attainable with nickel results in structures similarly limited in out-of-plane stiffness and robustness, MEMS valves having nickel valve plates are generally restricted to lower pressure fluid systems in order for the valve to operate with acceptable sealing. While out-of-plane stops for the valve plates may be helpful in increasing the pressure capabilities of a MEMS valve, stops are typically difficult to construct using conventional semiconductor processing techniques for MEMS valves having nickel valve plates. Thus, there exists a further need for more robust MEMS valves with valve plates having increased out-of-plane stiffness and thus for application in higher pressure fluid systems. In addition, it would be desirable for the valve construction to facilitate the formation of out-of-plane stops using conventional semiconductor processing techniques, wherein the stops would contribute to the stability and sealing ability of the valve plate.

SUMMARY OF THE INVENTION

The above and other needs are met by the present invention which, in one embodiment, provides a microelectromechanical (MEMS) valve comprising a microelectronic substrate defining at least one opening therethrough, a thermally actuated microactuator disposed thereon and comprised of a single crystalline material, such as silicon, and at least one valve plate comprised of a single crystalline material and having at least one valve seat. The valve plate is operably engaged with the microactuator and adapted to move the valve seat between a disengaged open position and an engaged closed position with respect to the corresponding opening in the microelectronic substrate. More particularly, thermal actuation of the microactuator causes the valve seat to be engaged and/or disengaged with the opening in the substrate as a result of the operable contact between the valve plate and the microactuator.

The microactuator preferably comprises a pair of spaced apart supports disposed on the substrate and at least one arched beam extending therebetween. The microactuator may also include an actuator member that is operably coupled to the at least one arched beam and which extends outwardly therefrom. The microactuator further includes means for heating the at least one arched beam to cause further arching such that the actuator member moves the valve plate between a closed position and an open position with respect to the opening in the substrate. In a closed position, the valve plate is positioned with the valve seat adjacent to the opening in the microelectronic substrate such that the valve seat engages and seals the opening. In an open position, the valve seat is at least partially disengaged from the opening such that the opening is not sealed. Accordingly, the MEMS valve of the present invention may be provided in a normally-closed or a normally-open configuration. Further, the MEMS valve may comprise at least one mechanical stop disposed adjacent the valve plate for providing an out-of-plane restraint for the valve plate, as well as facilitating alignment thereof, with respect to the substrate. In addition, the MEMS valve may also comprise at least one latch disposed on the substrate and capable of interacting with the valve plate, following a predetermined displacement thereof due to thermal actuation of the microactuator, such that the valve plate may be restrained in a predetermined position with respect to the opening without requiring continuous actuation of the microactuator. In some embodiments, the latch may be, for example, thermally actuated or electrostatically actuated.

As will be apparent, each arched beam of the microactuator is comprised of a semiconductor material and has opposed distal portions proximate the respective supports and a medial portion extending between the distal portions. According to one preferred embodiment, a metal layer is disposed on the distal portions of the arched beam, leaving the medial portion of the arched beam substantially free of the metal. Accordingly, an electrical current passing between the supports preferentially heats the medial portion of the arched beam and causes further arching thereof.

Another aspect of the present invention comprises the associated method to form a microelectromechanical valve having single crystalline components. According to one preferred method, a microelectronic substrate is initially formed that defines at least one opening therethrough comprising the valve opening. A first wafer comprised of a single crystalline material then has at least one valve seat formed thereon, either from the same single crystalline material or another suitable material, before being bonded upon a surface of the substrate such that the valve seat is adjacent the substrate. Thereafter, the first wafer is polished to a desired thickness. At least one mechanical stop is then formed adjacent the valve plate for providing an out-of-plane restraint for the valve plate, as well as facilitating alignment thereof, with respect to the substrate. At least one thermally actuated microactuator and at least one valve plate are then formed from the first wafer such that portions of the microactuator and the valve plate are moveable relative to the microelectronic substrate and such that the microactuator is operably engaged with the valve plate. In some embodiments, the microactuator and the valve plate may be at least partially formed from the first wafer prior to the first wafer being bonded to the substrate. Accordingly, thermal actuation of the microactuator causes the microactuator to move the valve plate, and thus the valve seat, between an open position and a closed position with respect to the opening defined by the microelectronic substrate to thereby form the valve. Further, at least one latch may also be formed on the substrate that is capable of interacting with the valve plate, following a predetermined displacement thereof due to thermal actuation of the microactuator, such that the valve plate may be restrained in a predetermined position with respect to the opening.

Thus, a MEMS valve can be formed in accordance with the present invention that includes arched beams and valve plates formed of a single crystalline silicon. Fabricating the arched beams and the valve plates from single crystalline silicon allows these components to be formed with aspect ratios of up to at least 10:1, particularly by using a deep reactive ion etching process. The higher aspect ratios of the arched beams and the valve plates increases their out-of-plane stiffness and constructs a more robust device having greater strength and stiffness. For example, a higher aspect ratio valve plate may accordingly allow operation of a MEMS valve in a higher pressure fluid system. The fabrication techniques of the present invention also permits the arched beams and other components to be more closely spaced. The closer spacing between adjacent silicon arched beams, for example, results in more effective transfer of heat between adjacent arched beams. In addition, the single crystalline silicon microactuator can be directly heated, such as by passing a current therethrough. As will be apparent, direct heating of the microactuator is generally more efficient than indirect heating. Further, although the coefficient of thermal expansion of silicon is less than that of metals, such as nickel, silicon is significantly less dense than nickel such that for a given amount of power, a silicon arched beam can generally be heated more, and therefore arch more, than a corresponding nickel arched beam. Therefore, the MEMS valve of the present invention can have greater out-of-plane stiffness, can be more robust, and the thermally actuated microactuators thereof can be more efficiently and controllably heated than conventional MEMS microactuators having metallic arched beams.

BRIEF DESCRIPTION OF THE DRAWINGS

Some of the advantages of the present invention having been stated, others will appear as the description proceeds, when considered in conjunction with the accompanying drawings, which are not necessarily drawn to scale, in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
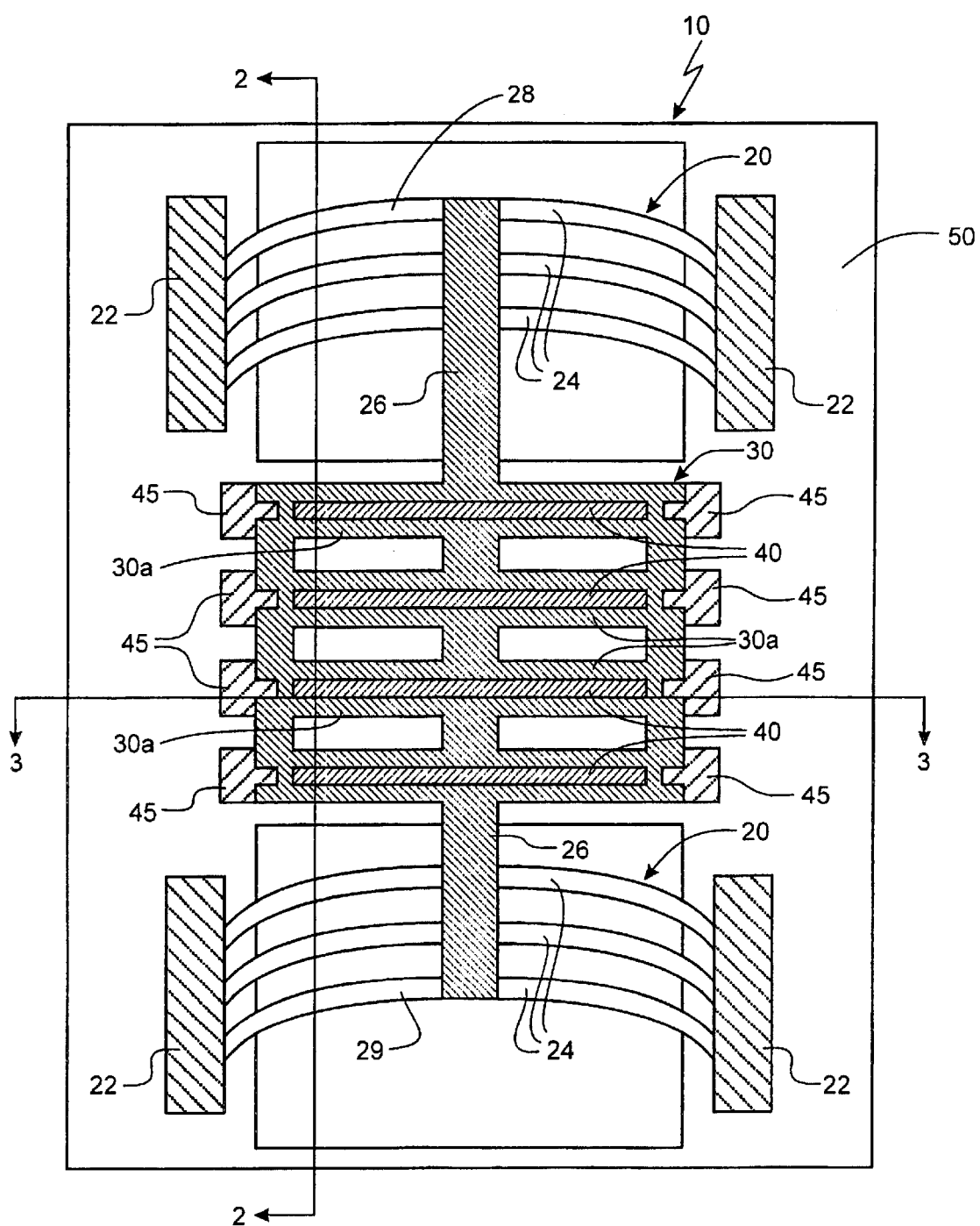
FIG. 1 is a plan view of a representative MEMS valve in accordance with one embodiment of the present invention.

FIG. 1 discloses an embodiment of a MEMS device and, in particular, a valve, indicated generally by the numeral 10, which includes the features of the present invention. The valve 10 generally comprises at least one microactuator 20 and at least one valve plate 30 for engaging corresponding valve openings 40 defined by an adjacent microelectronic substrate 50. While the microelectronic substrate 50 can be formed of a variety of materials, the substrate 50 preferably comprises a wafer of a microelectronic material, such as single crystalline silicon. Although the microactuator 20 can have various forms, the microactuator 20 of one advantageous embodiment includes a pair of spaced apart supports 22 affixed to the substrate 50 and at least one and, more preferably, a number of arched beams 24 extending between the spaced apart supports 22. According to the present invention, the supports 22, the arched beams 24, and the at least one valve plate 30 are preferably formed of a single crystalline material, such as single crystal silicon, and, more preferably, as a unitary structure formed from the same single crystalline silicon wafer.

According to one advantageous aspect of the present invention, the arched beams 24 are comprised of single crystalline silicon which has a relatively low coefficient of thermal expansion of $2.5 \times 10^{-6}/°K$, which is about one-fifth that of nickel. Surprisingly, however, silicon arched beams generally require less energy to be heated to the same temperature compared to nickel arched beams of the same size and shape. The reduction in energy required to heat the silicon arched beams results, in part, from the density of silicon of 2.33 g/cm$^3$ that is only about one-fourth that of nickel. In addition, silicon arched beams can be directly heated, thus providing more efficient heating than the indirect heating typically used for nickel arched beams.

Another advantage of silicon arched beams 24 is that a high aspect ratio lithography process (which currently limits the aspect ratio of nickel arched beams to 5:1) is not required. Instead, a deep reactive ion etching process is used in the formation of silicon arched beams, wherein this etching process can routinely produce aspect ratios of 10:1. The high aspect ratios for silicon arched beams increases the out-of-plane stiffness of the arched beams and contributes to more robust devices such as, for example, valves capable of operating at relatively higher pressures. In addition, the deep reactive ion etching process permits the arched beams to be more closely spaced than nickel arched beams, thus increasing the energy efficiency of the microactuator 20 due to improved heat transfer between adjacent silicon arched beams. For example, the silicon arched beams of the MEMS valve 10 of the present invention having an aspect ratio of 10:1 can have a center-to-center spacing of 10 $\mu$m and a gap between adjacent arched beams of 5 $\mu$m. For the foregoing reasons, a microactuator having silicon arched beams is therefore much more efficiently heated than conventional microactuators with nickel arched beams since the beams may be placed in closer proximity to adjacent beams. For instance, in one embodiment, a 40% reduction in the energy required to heat the silicon arched beams is obtained by reducing the configuration of silicon arched beams having a 10:1 aspect ratio from a center-to-center spacing of 22 $\mu$m with a 12 $\mu$m gap between adjacent arched beams to a center-to-center spacing of 10 $\mu$m with a 5 $\mu$m gap between adjacent arched beams.

The microactuator 20 also includes means for heating the arched beams 24. In one embodiment of the present invention, the microactuator 20 is thermally actuated by direct heating of the arched beams 24. For example, a potential difference can be applied between electrodes disposed upon the spaced apart supports 22 which causes a current to flow through the arched beams 24. The resistivity of the arched beams 24 causes heat to be produced in the arched beams 24 due to the current, thereby providing the necessary thermal actuation. Alternatively, the arched beams 24 can be indirectly heated to produce the thermal actuation of the microactuator 20 such as, for example, by a change in the ambient temperature about the arched beams 24 or by an external polysilicon heater disposed adjacent thereto. As shown in FIG. 1, the arched beams 24 are arched in a direction which preferably extends parallel to the substrate 50 in the desired or predetermined direction of motion of the microactuator 20. Thus, heating of the arched beams 24 causes further arching thereof in the predetermined direction, thereby resulting in useable displacement and mechanical force.

The microactuator 20 may also include a lengthwise extending actuator member 26 coupled to the arched beams 24 and extending outwardly therefrom. The actuator member 26 therefore serves as a coupler to mechanically couple a plurality of arched beams 24 between the spaced apart supports 22 as shown in FIG. 1. As such, further arching of the arched beams 24 in the predetermined direction displaces the actuator member 26 in the same predetermined direction. By mechanically coupling multiple arched beams 24 with the actuator member 26, the resulting microactuator 20 provides a higher degree of controlled displacement and force than would be provided by a single arched beam.

As further shown in FIG. 1, the at least one microactuator 20 of the present invention is preferably designed such that at least one valve plate 30 is operably engaged with the at least one microactuator 20, such as through actuator member 26, and actuated thereby. As also shown, the at least one microactuator 20 can include, for example, two microactuators 28 and 29 wherein one microactuator 28 is disposed on one side of the valve plate 30 and extends in a predetermined direction away from the valve plate 30 (in a "pull" configuration), while the other microactuator 29 is disposed on the opposite side of the valve plate 30 and extends in the same predetermined direction toward the valve plate 30 (in a "push" configuration). Both microactuators 28 and 29 thereby cooperate to control the displacement of the valve plate 30. Although the valve plate 30 can be formed in different manners, configurations, and shapes, the valve plate 30 of the illustrated embodiment includes arms 30a extending perpendicularly from the actuator member 26 corresponding to, and adapted to cover, adjacent elongated valve openings 40. While the supports 22 are affixed to the substrate 50, the valve plate 30 is formed integrally with the actuator member 26 and the arched beams 24 and can move relative to the substrate 50. Thus, the valve plate 30 is also formed of a single crystalline material, such as single crystalline silicon.

In operation, thermal actuation of the microactuators 28 and 29 displaces the actuator member 26 in the predetermined direction (the direction of arch of the arched beams 24), thereby also displacing the valve plate 30. Therefore, with respect to a normally-open valve 10, the valve plate 30, with the microactuators 28 and 29 in a non-actuated or ambient state, may be spaced apart from or incompletely cover the corresponding valve openings 40 in the microelectronic substrate 50. Upon thermal actuation of the microactuators 28 and 29, such as by direct heating of the arched beams 24, however, the valve plate 30 is preferably urged into engagement with the corresponding valve openings 40 in the microelectronic substrate 50. For proper sealing by the valve 10, the faces of the valve plates 30 adjacent the valve holes 40 preferably include valve seats (not shown in FIG. 1) for sealing the valve holes 40 when the valve plate 30 is disposed thereover. As such, the MEMS device of this embodiment may serve as a valve 10 by controllably opening and closing valve openings 40 through the microelectronic substrate 50 that forms the body of the valve 10. By appropriately connecting the valve 10 into a hydraulic system, the fluid flow therein can be controlled by selectively thermally actuating the microactuators 28 and 29. Further, a valve 10 according to the present invention may be formed in a number of different configurations, for example, as a normally-open valve, a normally-closed valve, or a combination thereof where some valve holes 40 may be opened by thermally actuating the microactuators 28 and 29, while other valve holes 40 are thereby closed. With respect to a normally-closed valve, the valve in an ambient state provides that the valve plate 30 is engaged with and seals the valve holes 40. Upon thermal actuation of the microactuators 28 and 29, the valve enters an actuated state where the arched beams 24 arch and displace the valve plate 30 such that the arms 30a are disengaged from the valve holes 40, thereby opening the valve holes 40.

As described below, the microactuators 28 and 29 and the valve plate 30 are typically formed on a substrate 50 which may be comprised of a variety of materials, such as silicon, glass, or quartz. Although not necessary for the practice of the invention, the microactuators 28 and 29 and the valve plate 30 are preferably formed as a unitary structure from a single crystalline material, such as silicon, that is provided in the form of a wafer. The microactuators 28 and 29 and the valve plate 30 are typically separated from the substrate 50 by an oxide layer and/or other intermediate layers (not shown) deposited on the substrate 50. The intermediate oxide layer is typically selectively removed such that portions remain, for example under the supports 22, but maybe not under the arched beams 24 or the actuator member 26, or the valve plate 30 to facilitate movement of these components with respect to the substrate 50.

With a separate layer/layers disposed between the substrate 50 and the microactuators 28 and 29/valve plate 30 structure, a gap may exist between the valve plate 30 and the valve holes 40 since the supports 22 are separated from the substrate 50 by the intermediate layer(s). As such, the valve 10 must be configured such that the valve plate 30 is capable of sealingly engaging the valve holes 40. For example, additional surface features on the surface of the substrate 50 surrounding the valve holes 40, such as a part of the intermediate layer, may be necessary to provide proper seating between the holes 40 and the valve plate 30. Also, according to a particularly advantageous embodiment of the present invention, the side of the valve plate 30 adjacent to the substrate 50 may have at least one valve seat (not shown) formed thereon to provide effective sealing between the valve plate 30 and the substrate 50 about the valve holes 40. The valve seat may be comprised of, for example, the same single crystalline silicon as the valve plate 30 or as a separate structure formed of, for instance, silicon nitride or polysilicon.

Since the valve plate 30 of the MEMS valve 10 according to the present invention must be movable with respect to the substrate 50, its only connections to the substrate 50 are, for example, the spaced apart supports 22 anchoring the arched beams 24 to the substrate 50. As such, this general structural characteristic of the microactuators 28 and 29 and the valve plate 30 could normally limit the operational pressure of the MEMS valve 10. However, the higher aspect ratio structures attainable through the use of, for instance, single crystalline silicon components formed with deep reactive ion etching, enhances the out-of-plane stiffness of the components and allows the MEMS valve 10 to operate at relatively higher pressures. In addition, the MEMS valve 10 according to an advantageous embodiment of the present invention may further include a series of out-of-plane mechanical stops 45 disposed adjacent the valve plate 30 and operably connected to the substrate 50. Preferably, the stops 45 are configured to have a tab portion that overlaps at least a portion of the valve plate so as to restrain out-of-plane deflection of the valve plate 30, as well as to facilitate the alignment thereof, with respect to the substrate 50. The stops 45 may thus further enhance the operational pressure limit of the MEMS valve 10.

Figure 2A:
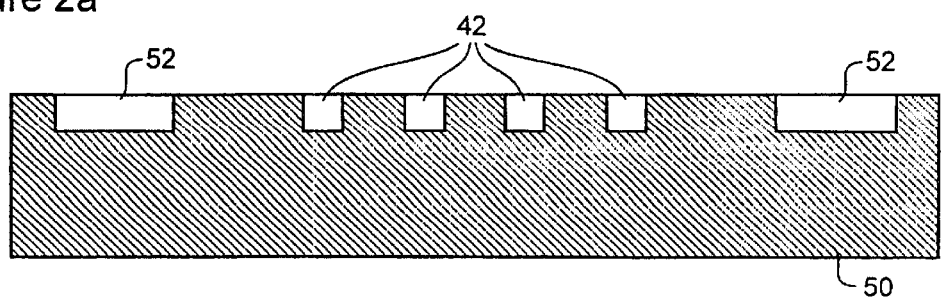
FIGS. 2A–2J are cross-sectional views taken along line 2—2 in FIG. 1 illustrating a sequence of operations performed during the fabrication of a MEMS valve according to an embodiment of the present invention.
Figure 2B:
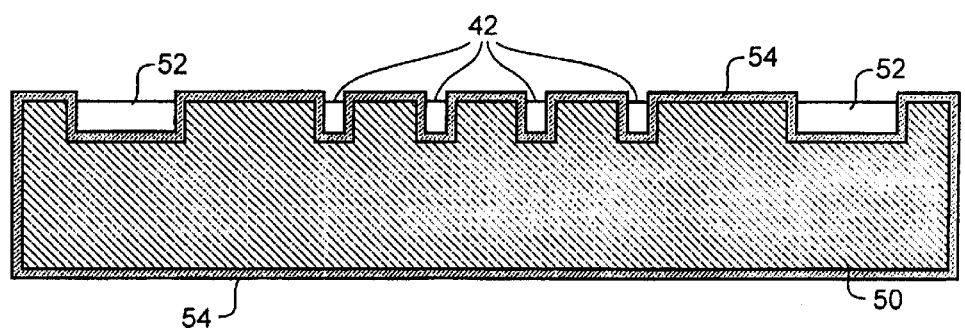
Figure 2C:
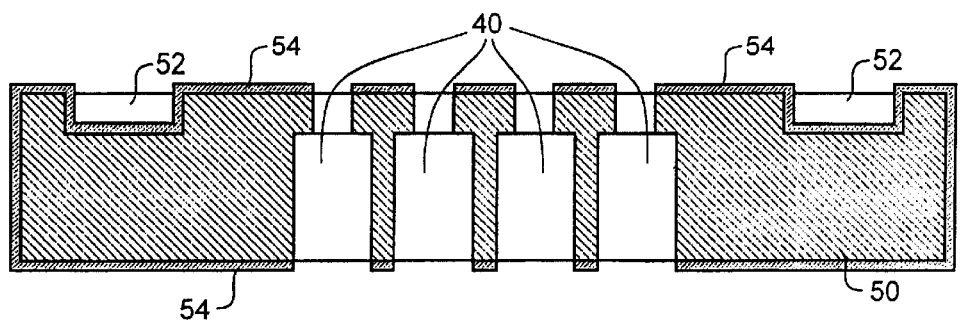

In accordance with the present invention, several associated methods may be used to produce the MEMS device, such as a valve 10, having single crystalline components. As shown in FIG. 2A and according to one advantageous method, a microelectronic substrate 50 is first fabricated with at least one wet etched or dry etched trench 52 for thermal isolation of the arched beams 24 of the microactuator 20 and with at least one partial valve opening 42. The substrate 50 is then oxidized such that an insulating oxide layer 54 is formed thereon as shown in FIG. 2B. Thereafter, as shown in FIG. 2C, the oxide layer 54 is selectively removed, for example, by wet etching, and the substrate 50 further etched to form the valve opening(s) 40.

Figure 2D:
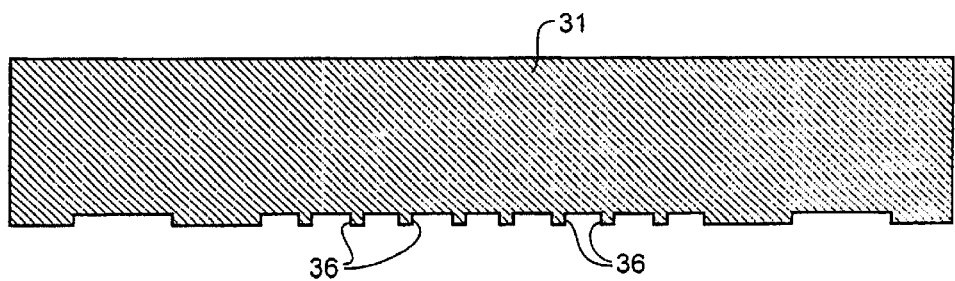
Figure 2E:
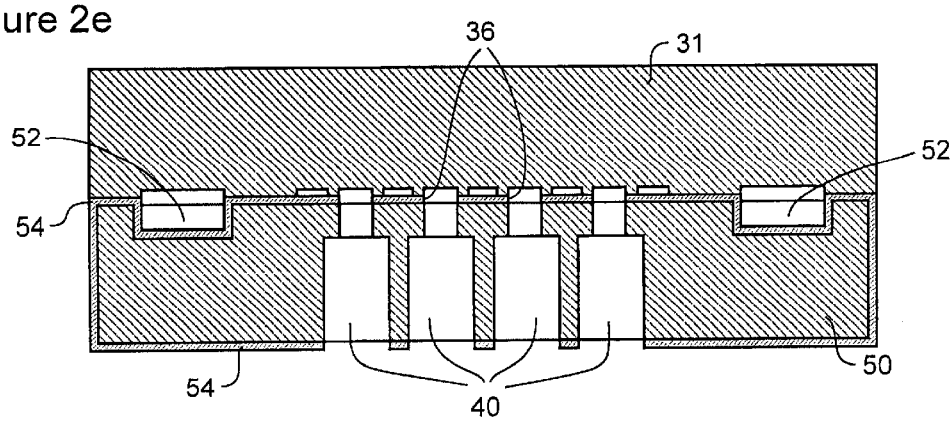
Figure 2F:
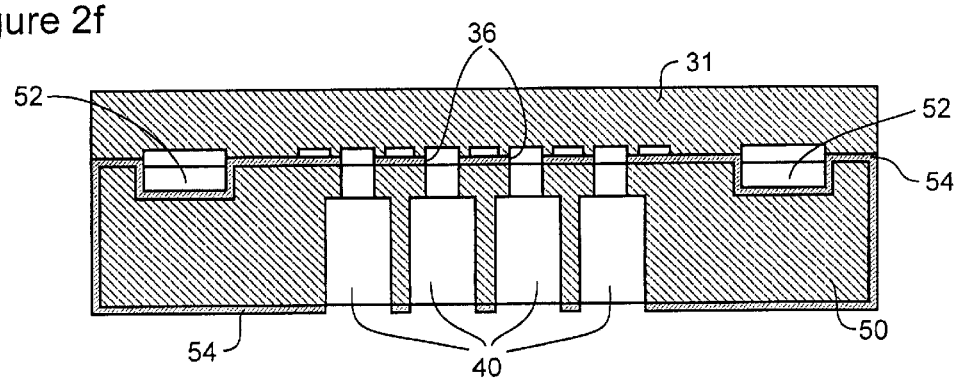

As shown in FIG. 2D, a first wafer 31 comprised of a single crystalline material, such as silicon, is then patterned to define at least one valve seat 36 corresponding to the valve openings 40 in the microelectronic substrate 50. At this point, the first wafer 31 may also be patterned and at least partially etched to define the at least one microactuator 20 and valve plate 30 structures, although the final microactuator 20 and valve plate 30 structures are typically formed after bonding the first wafer 31 to the substrate 50. Further, the first wafer 31 could also be selectively doped at this point in order to produce the desired conductivity characteristics such as, for example, about the arched beams 24. Once the microelectronic substrate 50 and the first wafer 31 have been prepared, the two wafers are bonded together as shown in FIG. 2E, for example, by fusion bonding. The two wafers are bonded together such that the at least one valve plate 30 is capable of engagement with the valve openings 40 via the valve seats 36 in either a normally-open or a normally-closed condition, as desired. Following the bonding process, the first wafer 31 is typically polished to a desired thickness as shown in FIG. 2F.

Figure 2G:
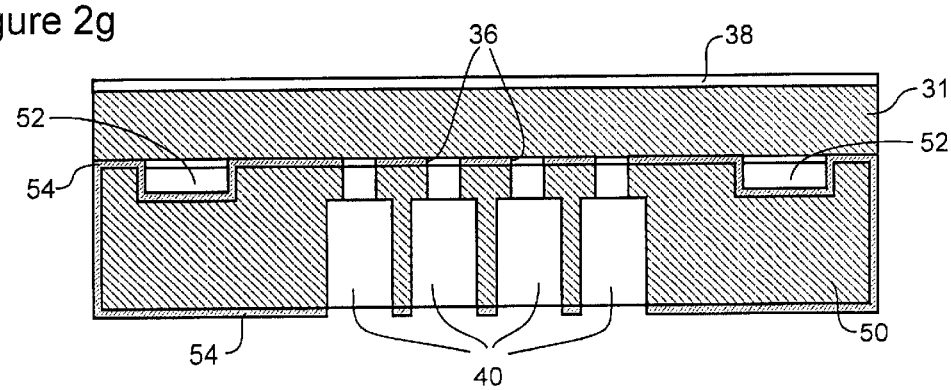
Figure 2H:
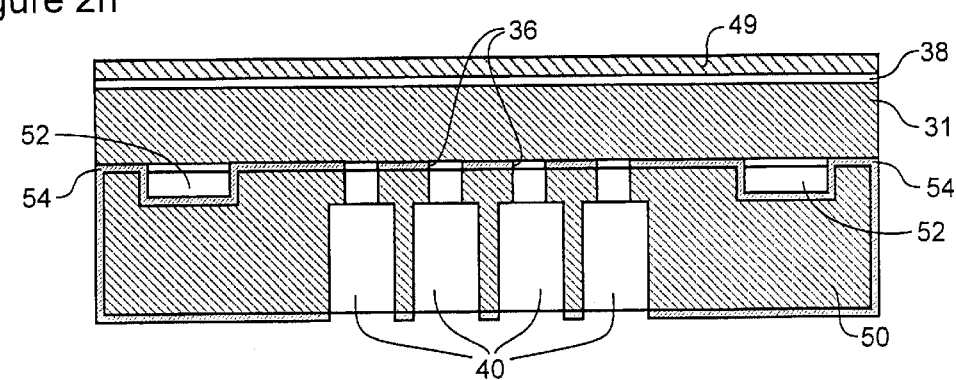
Figure 2I:
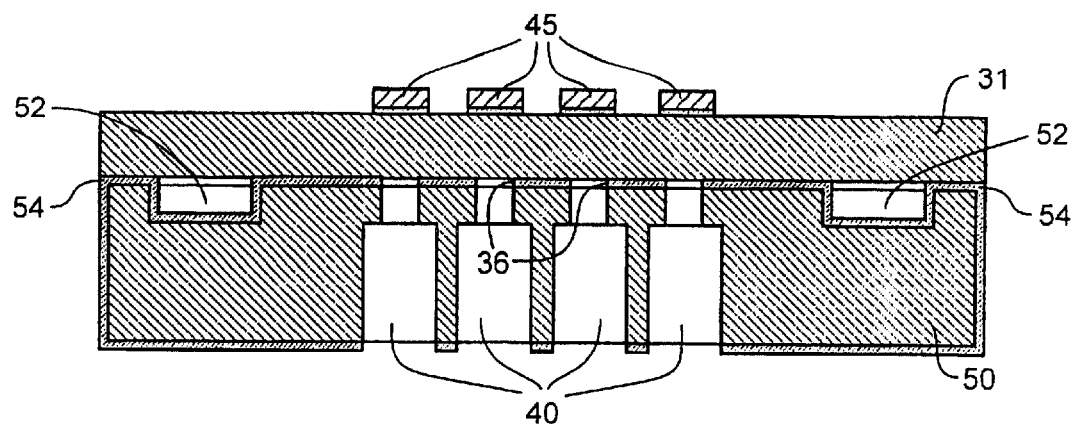
Figure 3A:
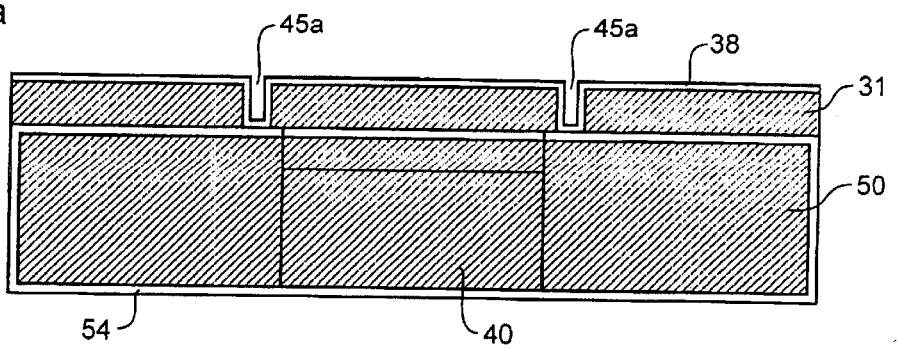
FIGS. 3A–3D are cross-sectional views taken along line 3—3 in FIG. 1 illustrating a sequence of operations performed during the fabrication of a MEMS valve according to an embodiment of the present invention.
Figure 3B:
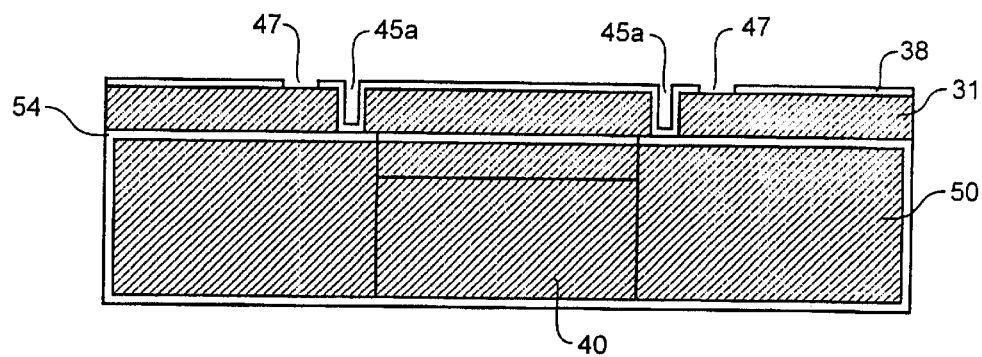
Figure 3C:
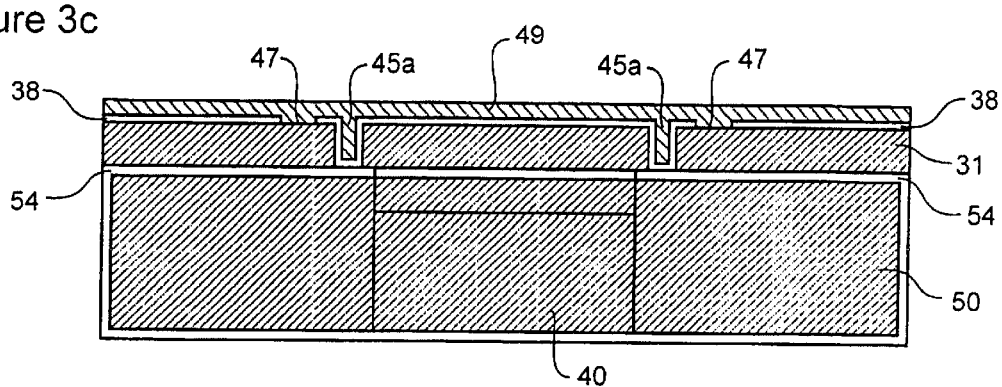
Figure 3D:
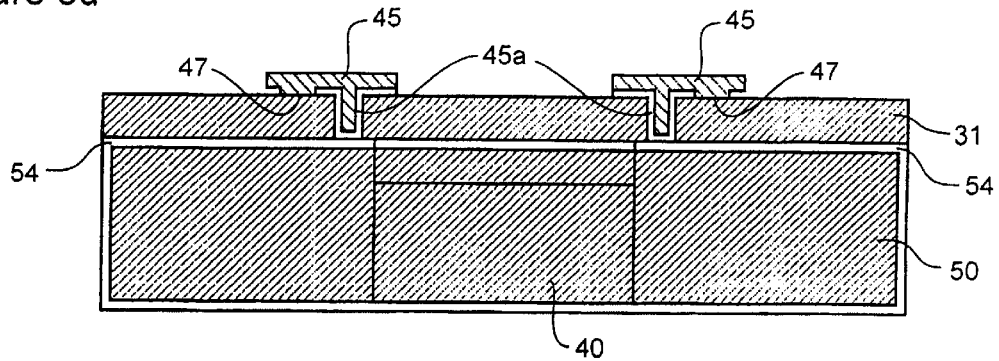

As shown in FIG. 2G, the first wafer 31 may then be oxidized to form an oxidation layer 38 thereon after the formation of holes 45a therein corresponding to the locations of the stops 45. The formation of the holes 45a for the stops 45 and the subsequent oxidation process are more particularly shown in FIG. 3A since the stops 45 are typically disposed perpendicularly to the cross-section as shown in FIG. 2G. Subsequently, as further shown in FIG. 3B, portions of the oxide layer 38 are then removed by etching to form anchor sites 47 for the stops 45. A polysilicon layer 49, for example, is then deposited on the oxide layer 38, as shown in FIGS. 2H and 3C, from which the stops 45 are then formed. FIGS. 2I and 3D further show that, following deposition of the polysilicon layer 49, the polysilicon layer 49 is then patterned and etched to form the stops 45 before the oxide layer 38 is removed by wet etching. The stops 45 are thus anchored to the first wafer 31 at the anchor sites 47 and extend over the edges of a portion of the first wafer 31 which is subsequently processed to form the valve plate 30.

Figure 2J:
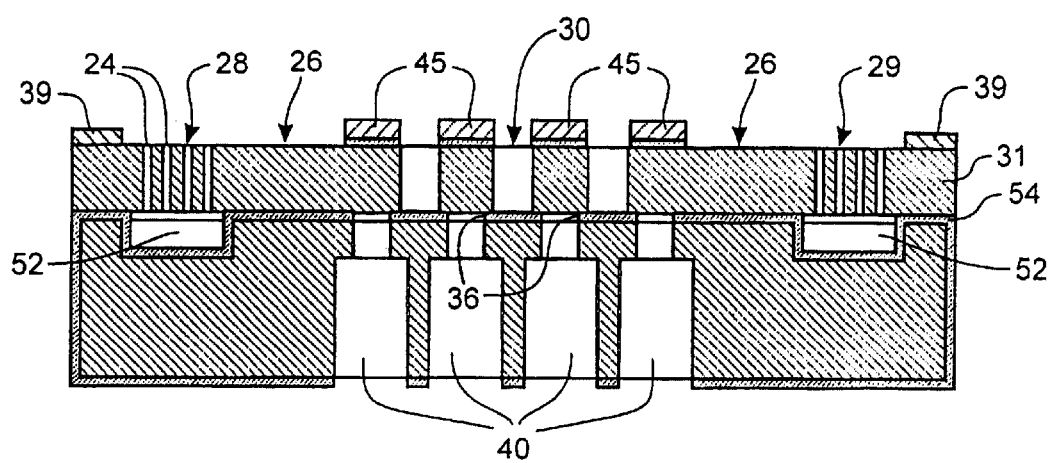

As shown in FIG. 2J, the microactuators 28 and 29 and the valve plate 30 may then be formed by etching the components, such as the supports 22, the arched beams 24, the actuator member 26, and the arms 30a, from the single crystalline silicon first wafer 31. As shown, the MEMS valve 10 may further include metal pads 39 formed by a metallization and etching process either before or after the at least one microactuator 20 and at least one valve plate 30 are formed, wherein the metal pads 39 facilitate electrical contact to the microactuators 28 and 29. In some embodiments, the metal pads 39 may facilitate electrostatic clamping of the valve plate 30 as a method of restraining the valve plate 30 in a predetermined position with respect to the valve openings 40.

Figure 4A:
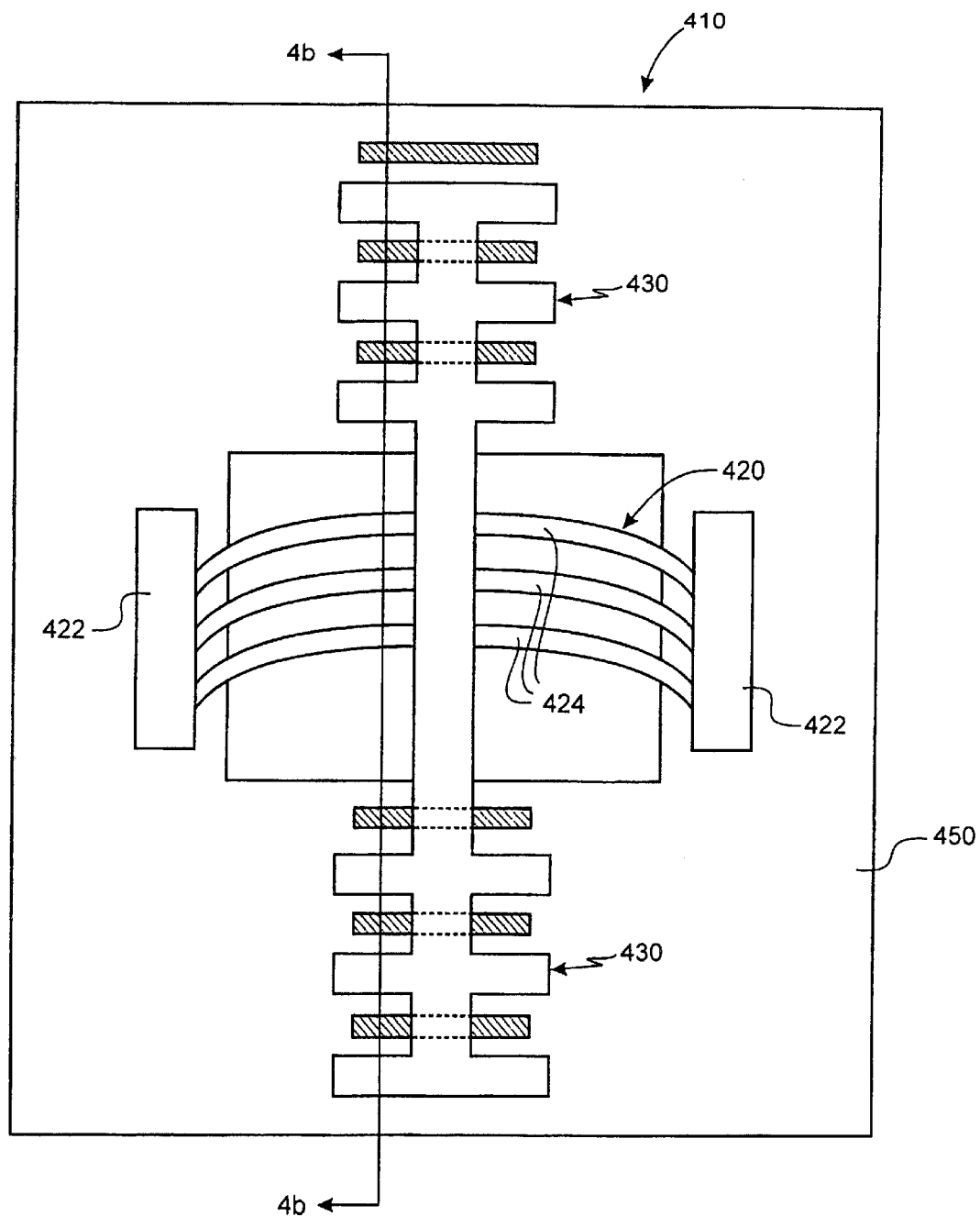
FIGS. 4A–4C are plan and cross-sectional views illustrating a MEMS valve employing a protective cover over the MEMS actuator according to another embodiment of the present invention.
Figure 4B:
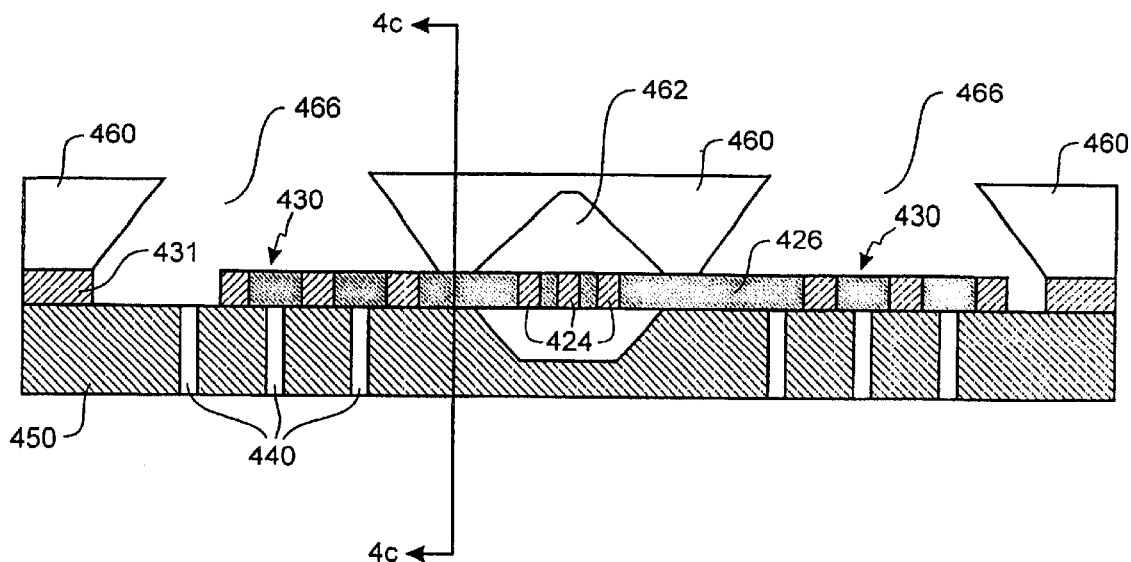
Figure 4C:
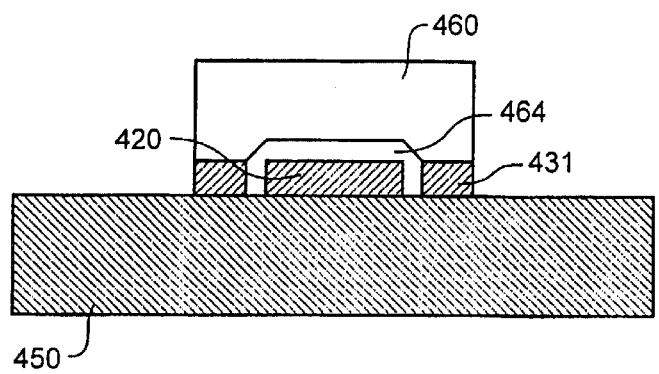

In more detail, at least one microactuator 20 and at least one valve plate 30 may be formed from a single crystalline silicon wafer by initially depositing a mask layer upon the single crystalline silicon first wafer 31. It will be understood by those having skill in the art that when a layer or element as described herein as being "on" another layer or element, it may be formed directly on the layer, at the top, bottom or side surface area, or one or more intervening layers may be provided between the layers. The mask layer is typically a photoresist or light sensitive polymer material. Once deposited upon the wafer 31, the mask layer is patterned such that the photoresist which remains on the wafer 31 defines the microactuators 28 and 29 (each generally comprised of a pair of spaced apart supports 22, at least one arched beam 24, and an actuator member 26) and the valve plate 30. Once the photoresist is patterned, the wafer 31 is etched so as to form the microactuators 28 and 29 and valve plate 30 structure. Preferably, the wafer 31 is etched by deep reactive ion etching capable of forming thin silicon structures from the wafer 31 having aspect ratios on the order of 10:1. The high aspect ratios for the silicon arched beams 24 and valve plate 30 increases the out-of-plane stiffness of these structures and contributes to more robust devices. In addition, the fabrication techniques of the present invention allow features and/or components to be more closely spaced. For example, closer spacing between adjacent silicon arched beams 24 increases the efficiency with which the arched beams 24 are heated due to increased heat transfer between adjacent beams 24. Once the wafer 31 has been etched, the photoresist is removed. At this point, the first wafer 31 may be further doped, either selectively or in a blanket process. Selective doping is used, for example, to separate conductive regions from non-conductive regions. More particularly, selective doping could be used, for instance, to form alternating heated and non-heated arched beams 24 or portions thereof By doping alternate arched beams 24 to enhance/inhibit the conductivity thereof, only alternating arched beams 24 would be heated and actuated by direct heating means, such as by flowing an electrical current therethrough. The non-conducting, non-heated arched beams 24 may subsequently be actuated by the ambient temperate thereabout produced by the adjacent heated arched beams 24. Thus, additional gains in efficiency and reduced energy consumption may be recognized since fewer arched beams 24 need to be heated by the electrical current to provide the desired degree of actuation, As shown in FIGS. 4A–C, and according to one advantageous embodiment of the present invention, a MEMS valve 410, shown in an alternate configuration with one microactuator 420 and two valve plates 430, may be provided with a second wafer 460 bonded thereto. Significant features of the second wafer 460 may include, for example, an appropriately etched cavity 462 disposed over the microactuator 420 so as to form a protective covering therefor. As further shown in FIG. 4B, the cavity 462 would extend over the actuator 420, covering the arched beams 424 and portions of the actuator member 426. As also shown in FIG. 4C, the second wafer 460 may further include an appropriately etched channel 464 at the ends of the cavity 462 such that the second wafer 460 is spaced apart from the actuator member 426 of the microactuator 420 to allow movement and operation thereof. FIG. 4B also shows that the second wafer 460 may further be configured to provide vias 466, appropriately spaced to correspond to the valve portions of the valve 410, to provide appropriate conduits for the flow of the fluid controlled by the valve 410. The second wafer 460 is then bonded to the first wafer 431, such as by a fusion bonding or an anodic bonding process, to permit operation of the valve 410 as described. As bonded to the first wafer 431, the second wafer 460 may also serve as an out-of-plane mechanical stop for the microactuator 420.

Figure 5:
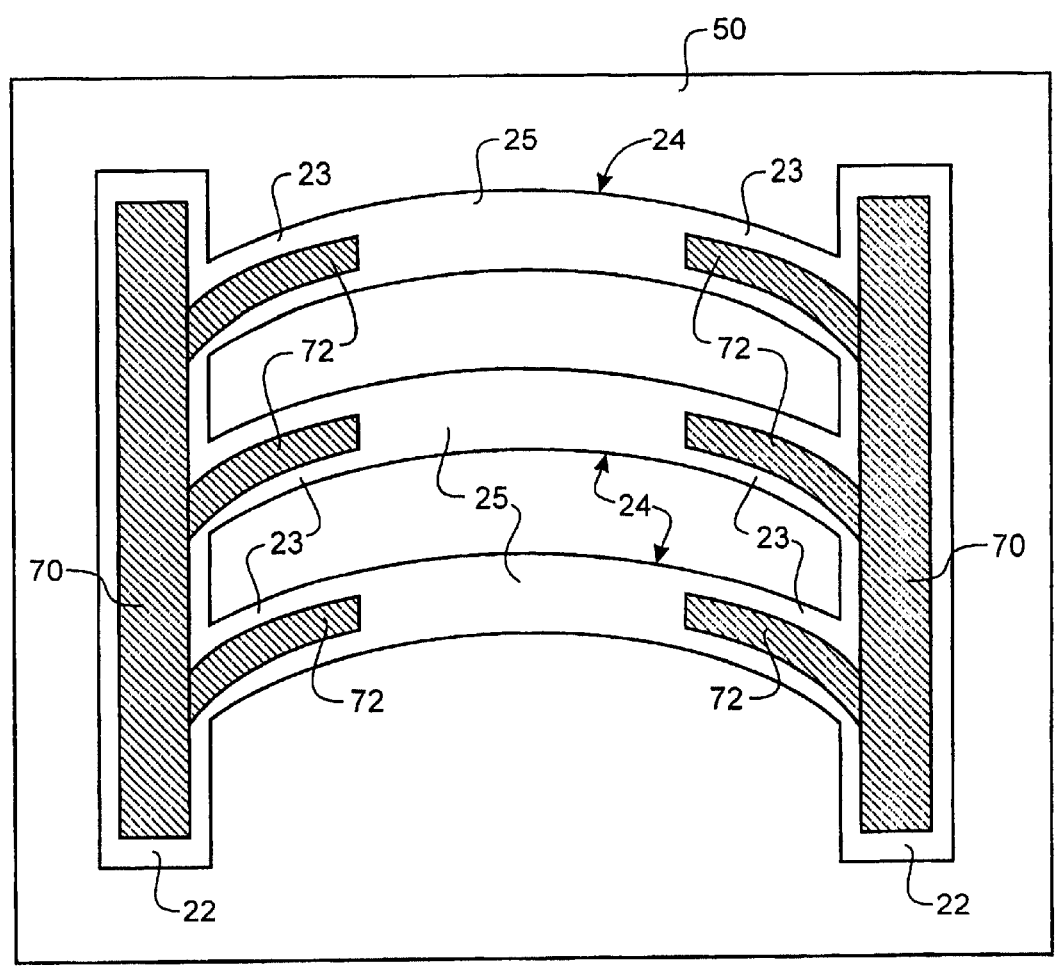
FIG. 5 is a plan view of a MEMS actuator according to still another embodiment of the present invention.

A further aspect of the present invention as described herein includes a metallization step used to define interconnects and contact pads about the MEMS valve 10. As shown in FIG. 5, metallization may also be used to more particularly define and control the heating characteristics of the arched beams 24. A typical arched beam 24 is formed of a semiconductor material and comprises distal ends 23, each disposed adjacent the respective supports 22, and a medial portion 25 extending between the distal ends 23. Accordingly, a metallization layer or trace 70 is evaporated on the supports 22 to serve as contact pads for a current source (not shown) operably connected therebetween. Application of an electrical current between the supports 22 and across the arched beams 24 internally generates the heat necessary to thermally actuate the arched beams 24 due to the resistivity of the arched beams 24. Evaporation typically involves depositing a metal, such as nickel, copper, or gold, on the desired surface. Portions of the metal are then removed by, for example, a wet etch process to form the desired metal configuration on the microactuator 20 structure. Alternatively, a lift-off process may be used to configure the evaporated metal, wherein a photoresist may be applied to the microactuator 20 structure and patterned to leave photoresist on portions of the microactuator 20 where metal is not desired. Removal of the photoresist following the metal evaporation process thus also removes the undesired metal to leave the desired metal configuration on the microactuator 20 structure.

Surprisingly, it has been found that extending the evaporated metal layer 70 from the supports 22 onto the distal portions 23 of the arched beams 24 concentrates the heated region of the arched beams 24 to the medial portions 25 thereof. The metallization traces 72 extending onto the distal portions 23 of the arched beams 24 provide a low resistance pathway for the current to flow. At the ends of the traces 72, the current is then forced to flow through the higher resistance, medial portions 25 of the silicon arched beams 24. Thus, the medial portions 25 of the arched beams 24 experience a greater heating effect due to the current than the distal portions 23 thereof, such that much greater thermal actuation is achieved at the medial portions 25 of the arched beams 24 to produce the desired displacement of the microactuator 20. Reducing the heated region of the arched beams 24 may further provide a corresponding reduction in the energy required to heat the arched beams 24 to achieve the desired displacement.

Figure 6:
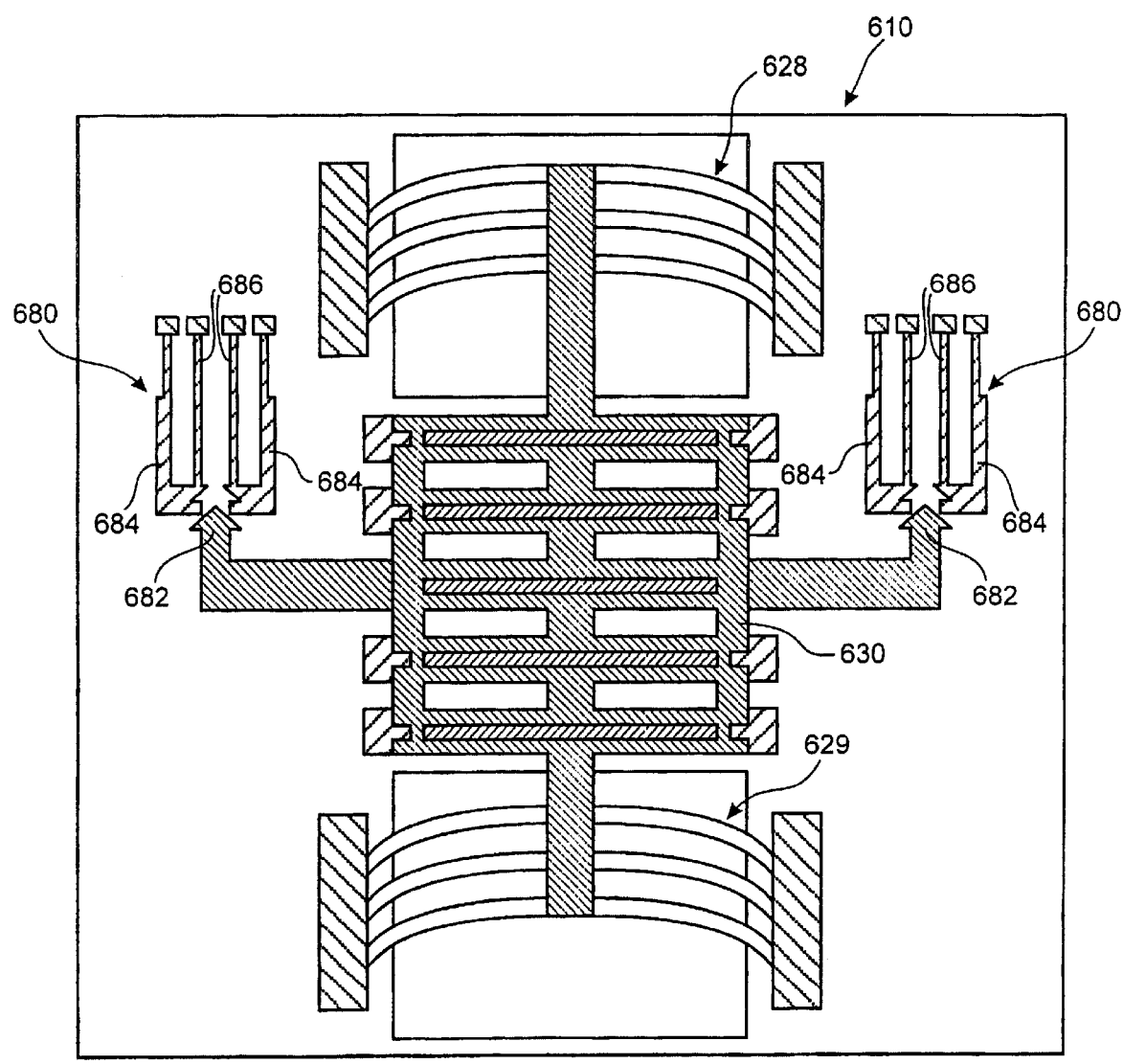
FIG. 6 is a plan view of a preferred embodiment of a MEMS valve according to the present invention and including a thermal latch.

FIG. 6 shows yet another advantageous embodiment of the present invention, similar to the embodiment shown in FIG. 1, but further comprising at least one latch 680 configured to interact with at least one corresponding engaging member 682 operably connected to the valve plate 630. According to one embodiment of the present invention, the MEMS valve 610 may have a latch 680 and corresponding engaging member 682 disposed on either side of the valve plate 630. The latch 680 may further be configured for thermal operation. That is, for example, each side of the latch 680 may be comprised of two strips of silicon 684 and 686, wherein one of the strips is narrower than the other. The application of an electrical current through the latch 680 results in the latch 680 being heated due to the resistance of the silicon strips 684 and 686. Since the narrower strip 686 typically has a higher resistance due to the smaller cross-sectional area, it will be heated to a greater extent than the wider strip 684. Thus, as shown in FIG. 6, the narrower strip 686 will expand more than the wider strip 684 and cause the sides of the latch 680 to diverge. Subsequent actuation of the microactuators 628 and 629 causes the valve plate 630, and thus the engaging members 682, to be displaced toward the latches 680. Once the engaging members 682 are displaced to a position between the sides of the respective latches 680, the flow of electrical current through the latches 680 can be halted, thus causing the sides of the latches 680 to cool and converge to their original configurations and trapping the corresponding engaging member 682 therebetween. The valve 610 may then be deactuated such that the valve plate 630 is maintained in the desired position by the latches 680, thus retaining the valve 610 in an "actuated" position without relying on an electrical actuation source for the microactuators 628 and 629. The valve 610 is subsequently returned to its "deactuated" position by reversing the detailed steps. The thermal latches 680 thus facilitate additional energy conservation for a MEMS valve 610 by providing a valve maintainable in an actuated position without requiring a continuous energy input to either the microactuators 628 and 629 or the thermal latches 680.

Thus, a MEMS device, such as a valve 10, can be formed in accordance with the present invention that includes arched beams 24 and at least one valve plate 30 formed as a unitary structure from single crystalline silicon. Fabricating the arched beams 24 and the valve plate 30 from single crystalline silicon allows the arched beams 24 and valve plate 30 to be precisely formed. More particularly, the arched beams 24 and valve plate 30 may be formed with aspect ratios of up to at least 10:1, more particularly by using a deep reactive ion etching process. The higher aspect ratios of these components increases their out-of-plane stiffness and constructs a more robust device. The fabrication techniques of the present invention also permit components of the valve 10 to be more closely spaced. The closer spacing between adjacent silicon arched beams 24, for example, results in more effective transfer of heat between adjacent arched beams 24. In addition, the single crystalline silicon microactuator 20 can be directly heated, such as by passing a current therethrough, which is generally more efficient than indirect heating. Further, although the coefficient of thermal expansion of silicon is less than that of metals, such as nickel, silicon is significantly less dense than nickel such that for a given amount of power, a silicon arched beam can generally be heated more than a corresponding nickel arched beam. The heating effect may further be enhanced by the extension of the metallization traces onto the silicon arched beams to controllably constrain the dimensions of the thermally actuated portion of the silicon arched beam. The inclusion of thermal latches may further increase the efficiency of MEMS valves by permitting the valve plates to be maintained in an actuated position without requiring a continuous energy input to either the microactuators or the latches. Therefore, the MEMS valve of the present invention can have greater out-of-plane stiffness, can be more robust, and can be more controllably and efficiently heated and actuated than conventional MEMS devices having metallic arched beams.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A microelectromechanical valve comprising:
   a microelectronic substrate defining at least one opening therethrough;
   a thermally actuated microactuator disposed upon the substrate and comprised of a single crystalline material; and
   at least one valve plate comprised of the single crystalline material, the at least one valve plate being operably engaged with the microactuator and adapted to move upon thermal actuation of the microactuator.

2. A microelectromechanical valve according to claim 1, wherein the at least one valve plate further comprises at least one valve seat, the at least one valve plate adapted to move the at least one valve seat between a disengaged open position and an engaged closed position with respect to the at least one opening upon thermal actuation of the microactuator.

3. A microelectromechanical valve according to claim 2 wherein the microactuator further comprises:
   spaced apart supports disposed on the substrate; and
   at least one arched beam extending between the spaced apart supports and operably engaged with the at least one valve plate.

4. A microelectromechanical valve according to claim 3 wherein the microactuator further comprises means for heating the at least one arched beam to cause further arching thereof such that the valve seat moves between a first position in which the valve seat is engaged with the at least one opening and closes the valve and a second position in which the valve seat is disengaged from the at least one opening and opens the valve.

5. A microelectromechanical valve according to claim 3 wherein the microactuator further comprises an actuator member for coupling the plurality of arched beams together.

6. A microelectromechanical valve according to claim 2 wherein the valve plate is disposed in a normally closed position with respect to the opening such that thermal actuation of the microactuator displaces the valve plate and causes the valve seat to disengage and open the opening.

7. A microelectromechanical valve according to claim 2 wherein the valve plate is disposed in a normally open position with respect to the opening such that thermal actuation of the microactuator displaces the valve plate and causes the valve seat to engage and close the opening.

8. A microelectromechanical valve according to claim 2 wherein the at least one valve seat is comprised of at least one of a single crystalline silicon, silicon nitride, and polysilicon.

9. A microelectromechanical valve according to claim 1 wherein the microactuator is thermally actuated by internal heating thereof.

10. A microelectromechanical valve according to claim 1 wherein the microactuator is thermally actuated by external heating thereof.

11. A microelectromechanical valve according to claim 1 wherein the microactuator is comprised of single crystalline silicon.

12. A microelectromechanical valve according to claim 1 wherein the at least one valve plate is comprised of single crystalline silicon.

13. A microelectromechanical valve according to claim 1 further comprising at least one mechanical stop disposed adjacent the valve plate for providing an out-of-plane restraint for the valve plate with respect to the substrate.

14. A microelectromechanical valve comprising:

a microelectronic substrate defining at least one opening therethrough;

a thermally actuated microactuator disposed upon the substrate and comprised of a single crystalline material;

at least one valve plate comprised of a single crystalline material the at least one valve plate being operably engaged with the microactuator and adapted to move upon thermal actuation of the microactuator; and at least one latch disposed on the substrate and capable of interacting with the valve plate following a predetermined displacement thereof due to thermal actuation of the microactuator such that the valve plate may be restrained in a predetermined position with respect to the opening.

15. A microelectromechanical valve according to claim 14 wherein the latch is at least one of a thermally actuated latch and an electrostatically actuated latch.

* * * * *